(12) United States Patent
Liu et al.

(10) Patent No.: US 12,604,420 B2
(45) Date of Patent: Apr. 14, 2026

(54) SENSOR PACKAGE STRUCTURE AND MANUFACTURING METHOD THEREOF

(71) Applicant: TONG HSING ELECTRONIC INDUSTRIES, LTD., Taipei City (TW)

(72) Inventors: Yu-Hsiang Liu, Taipei City (TW); Li-Chun Hung, Hsin-Chu County (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 365 days.

(21) Appl. No.: 18/472,181

(22) Filed: Sep. 21, 2023

(65) Prior Publication Data

US 2024/0397633 A1 Nov. 28, 2024

(30) Foreign Application Priority Data

May 26, 2023 (TW) ................................. 112119632

(51) Int. Cl.
| | |
|---|---|
| *H05K 3/3452* | (2026.01) |
| *H05K 3/303* | (2026.01) |
| *H10W 70/65* | (2026.01) |
| *H10W 72/00* | (2026.01) |
| *H10W 72/30* | (2026.01) |
| *H10W 72/50* | (2026.01) |

(52) U.S. Cl.
CPC ........... *H05K 3/3452* (2013.01); *H05K 3/305* (2013.01); *H10W 70/65* (2026.01); *H10W 72/50* (2026.01); *H05K 2201/099* (2013.01); *H10W 72/07653* (2026.01); *H10W 72/354* (2026.01)

(58) Field of Classification Search
CPC ................. H05K 3/3452; H05K 3/305; H05K 2201/099; H10W 70/65; H10W 72/50; H10W 72/07653; H10W 72/354
See application file for complete search history.

(56) References Cited

U.S. PATENT DOCUMENTS

| | | | |
|---|---|---|---|
| 2009/0053850 A1* | 2/2009 | Nishida | H10F 39/804 257/E21.001 |
| 2010/0019373 A1* | 1/2010 | Fan | H05K 3/3452 257/E23.079 |

* cited by examiner

*Primary Examiner* — Steven B Gauthier
*Assistant Examiner* — Marc-Anthony Armand
(74) *Attorney, Agent, or Firm* — Li & Cai Intellectual Property Office

(57) ABSTRACT

A sensor package structure and a manufacturing method thereof are provided. The sensor package structure includes a substrate, a first solder mask layer, a convex structure, a sensing chip, and an engaging layer. The first solder mask layer is disposed on the substrate. The convex structure is disposed on the first solder mask layer. The convex structure has a first stepped surface, and the first stepped surface is higher than an upper surface of the first solder mask layer. The sensing chip is disposed above the substrate. The engaging layer is adhered between the substrate and the sensing chip and covers the convex structure, such that the convex structure and the sensing chip are not in contact with each other.

9 Claims, 15 Drawing Sheets

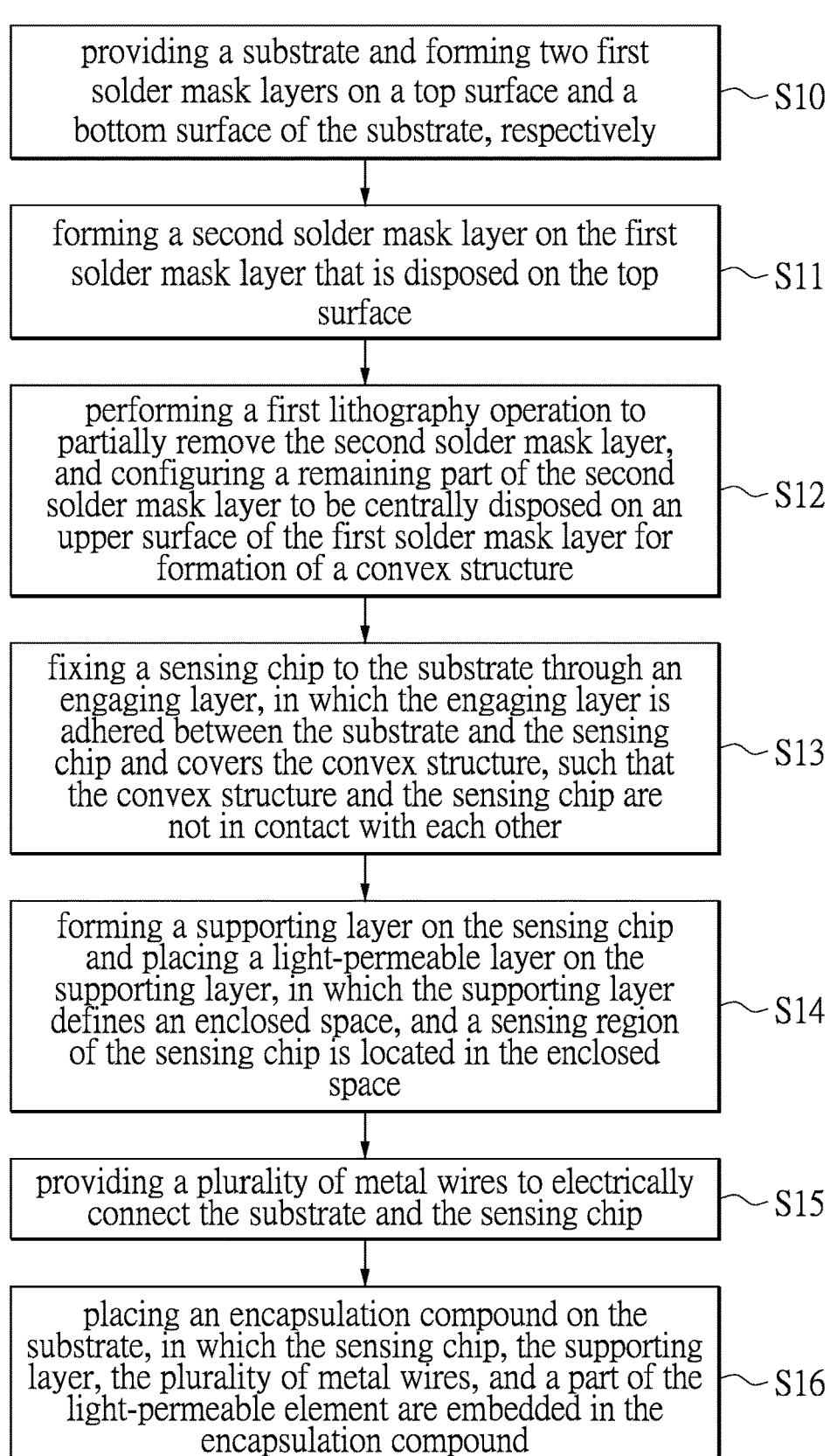

providing a substrate and forming two first solder mask layers on a top surface and a bottom surface of the substrate, respectively — S10 forming a second solder mask layer on the first solder mask layer that is disposed on the top surface — S11 performing a first lithography operation to partially remove the second solder mask layer, and configuring a remaining part of the second solder mask layer to be centrally disposed on an upper surface of the first solder mask layer for formation of a convex structure — S12 fixing a sensing chip to the substrate through an engaging layer, in which the engaging layer is adhered between the substrate and the sensing chip and covers the convex structure, such that the convex structure and the sensing chip are not in contact with each other — S13 forming a supporting layer on the sensing chip and placing a light-permeable layer on the supporting layer, in which the supporting layer defines an enclosed space, and a sensing region of the sensing chip is located in the enclosed space — S14 providing a plurality of metal wires to electrically connect the substrate and the sensing chip — S15 placing an encapsulation compound on the substrate, in which the sensing chip, the supporting layer, the plurality of metal wires, and a part of the light-permeable element are embedded in the encapsulation compound — S16

FIG. 19

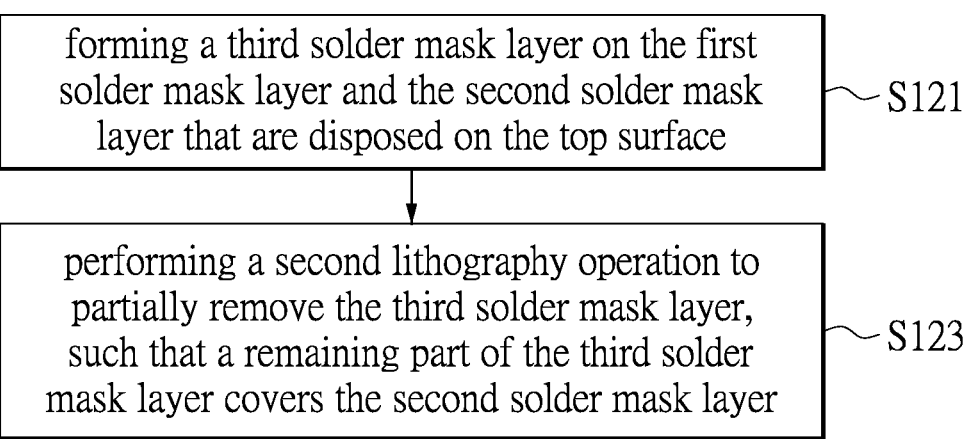

| |
|---|
| forming a third solder mask layer on the first solder mask layer and the second solder mask layer that are disposed on the top surface |

S121

| |
|---|
| performing a second lithography operation to partially remove the third solder mask layer, such that a remaining part of the third solder mask layer covers the second solder mask layer |

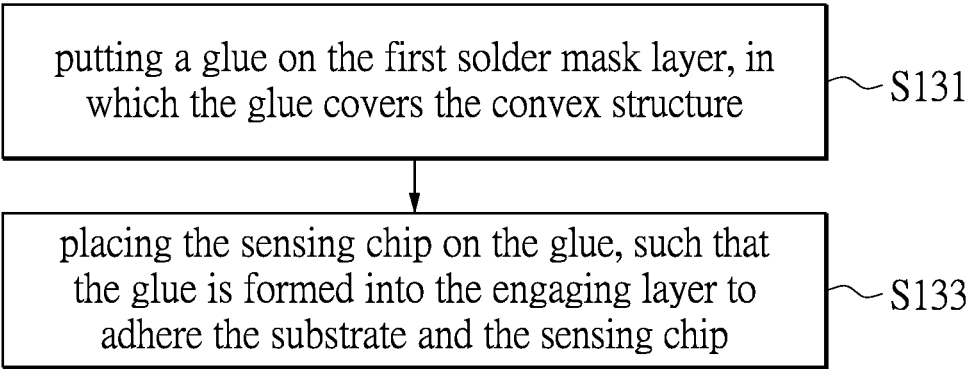

| |
|---|
| putting a glue on the first solder mask layer, in which the glue covers the convex structure |

S131

| |
|---|
| placing the sensing chip on the glue, such that the glue is formed into the engaging layer to adhere the substrate and the sensing chip |

S133

FIG. 21 forming a die attach film on a lower surface of the sensing chip ～S132 placing the sensing chip on the first solder mask layer, such that the die attach film covers the convex structure and is formed into the engaging layer to adhere the substrate and the sensing chip ～S134

SENSOR PACKAGE STRUCTURE AND MANUFACTURING METHOD THEREOF

CROSS-REFERENCE TO RELATED PATENT APPLICATION

This application claims the benefit of priority to Taiwan Patent Application No. 112119632, filed on May 26, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure and a manufacturing method thereof, and more particularly to a sensor package structure and a manufacturing method thereof.

BACKGROUND OF THE DISCLOSURE

In the existing packaging process of an image sensor, a sensing chip and a substrate can generally be bonded to each other by use of an adhesive material, such as a liquid compound or a die attach film. However, during the adhesion process, air bubbles will be generated on an adhesive surface of the adhesive material between the sensing chip and the substrate, and these air bubbles will remain in the cured adhesive layer. When too many air bubbles are generated on the adhesive surface, the adhesion strength between the sensing chip and the substrate is likely to be insufficient, thereby negatively affecting the reliability of a package structure. In addition, such air bubbles impede heat conduction, such that the package structure does not easily dissipate heat.

Therefore, how to overcome the above-mentioned problem through an improvement in structural design has become an important issue to be addressed in the related art.

SUMMARY OF THE DISCLOSURE

In response to the above-referenced technical inadequacy, the present disclosure provides a sensor package structure and a manufacturing method thereof, so as to address an issue of air bubbles remaining in an adhesive layer between a sensing chip and a substrate.

In order to solve the above-mentioned problem, one of the technical aspects adopted by the present disclosure is to provide a sensor package structure, which includes a substrate, a first solder mask layer, a convex structure, a sensing chip, and an engaging layer. The first solder mask layer is disposed on the substrate. The convex structure is disposed on the first solder mask layer. The convex structure has a first stepped surface, and the first stepped surface is higher than an upper surface of the first solder mask layer. The sensing chip is disposed above the substrate. The engaging layer is adhered between the substrate and the sensing chip. The engaging layer covers the convex structure, such that the convex structure and the sensing chip are not in contact with each other.

In order to solve the above-mentioned problem, another one of the technical aspects adopted by the present disclosure is to provide a method of manufacturing a sensor package structure, which includes: providing a substrate, and forming two first solder mask layers on a top surface and a bottom surface of the substrate, respectively; forming a second solder mask layer on the first solder mask layer that is disposed on the top surface; performing a first lithography operation to partially remove the second solder mask layer, and configuring a remaining part of the second solder mask layer to be centrally disposed on an upper surface of the first solder mask layer for formation of a convex structure; and fixing a sensing chip to the substrate through an engaging layer, in which the engaging layer is adhered between the substrate and the sensing chip and covers the convex structure, such that the convex structure and the sensing chip are not in contact with each other.

Therefore, in the sensor package structure and the manufacturing method thereof provided by the present disclosure, the convex structure can be formed on the first solder mask layer of the substrate. Hence, the sensing chip will first contact the convex structure when being adhered to the substrate through the engaging layer, such that the air is squeezed from the inside to diffuse outward, and the residual air bubbles inside the engaging layer can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 19 is a flowchart of a manufacturing method of a sensor package structure according to the present disclosure;

FIG. 20 is a flowchart showing step S121 to step S123 of the manufacturing method of the sensor package structure according to the present disclosure;

FIG. 21 is a flowchart showing step S131 to step S133 of the manufacturing method of the sensor package structure according to the present disclosure.

DETAILED DESCRIPTION OF THE EXEMPLARY EMBODIMENTS

Figure 1:
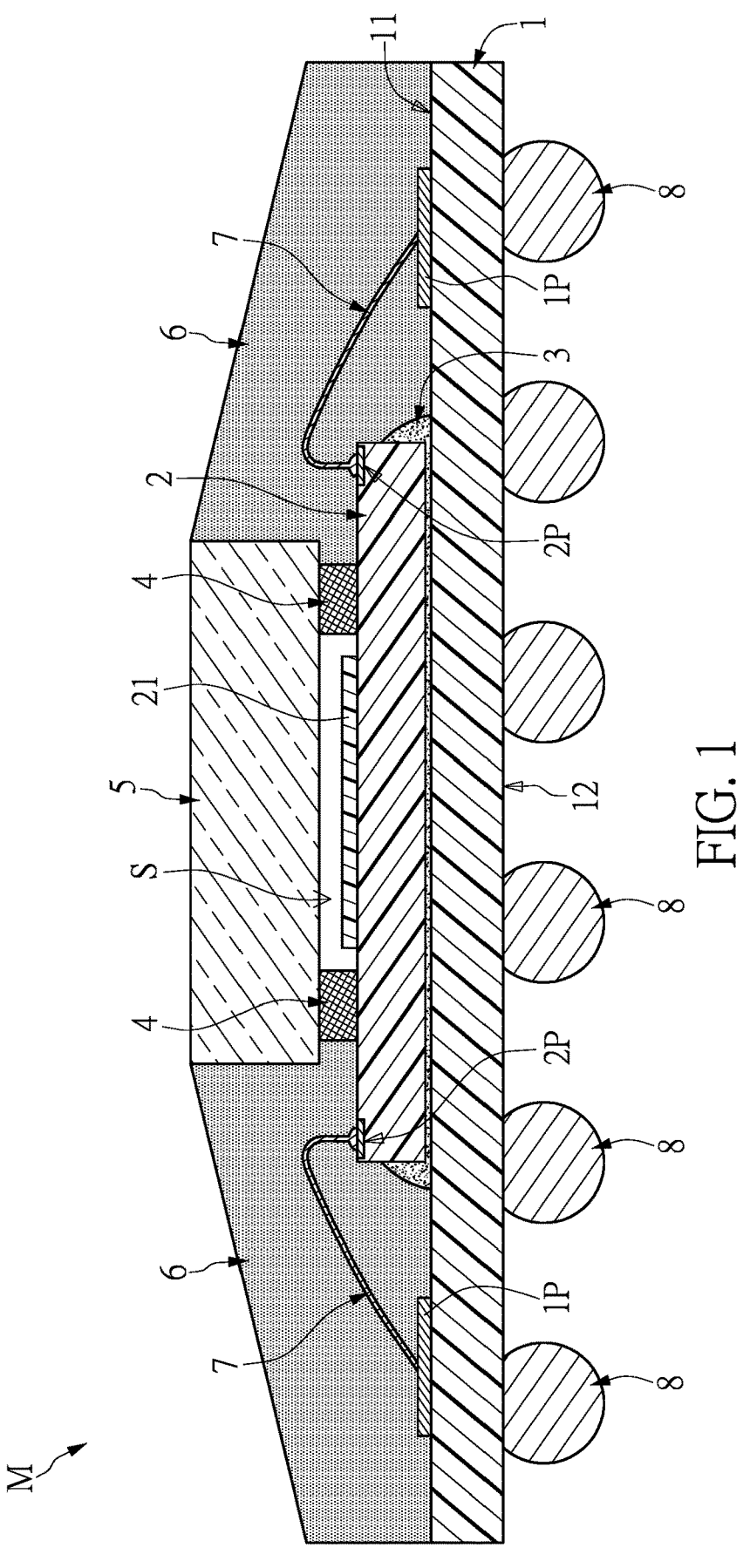
FIG. 1 is a schematic cross-sectional view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
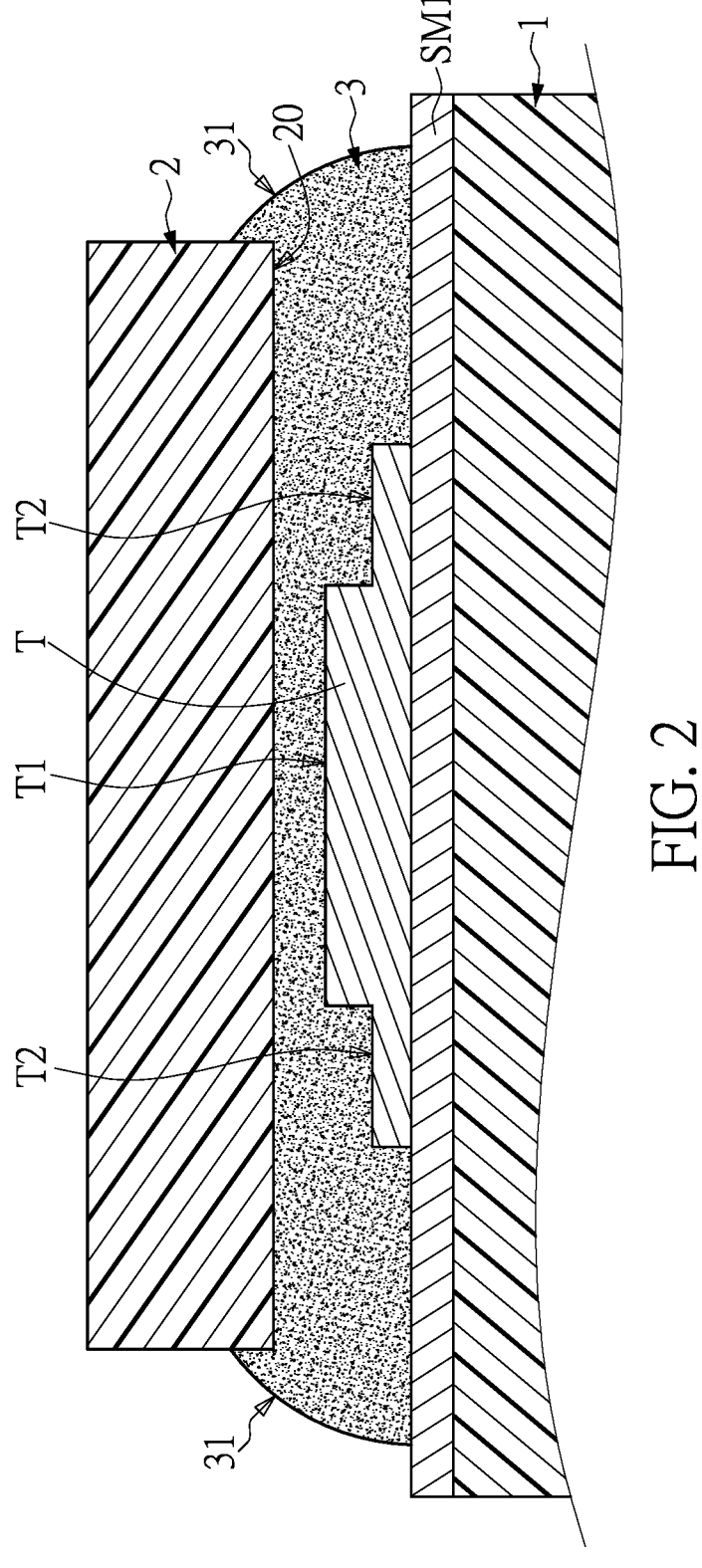
FIG. 2 is a partial schematic enlarged view of the sensor package structure according to the first embodiment of the present disclosure.

Referring to FIG. 1 and FIG. 2, FIG. 1 is a schematic cross-sectional view of a sensor package structure according to a first embodiment of the present disclosure, and FIG. 2 is a partial schematic enlarged view of the sensor package structure according to the first embodiment of the present disclosure. A first embodiment of the present disclosure provides a sensor package structure, which includes a substrate 1, a first solder mask layer SM1, a convex structure T, a sensing chip 2, and an engaging layer 3. The substrate 1 has a top surface 11 and a bottom surface 12 that are opposite to each other. The first solder mask layer SM1 is disposed on the top surface 11 of the substrate 1. Moreover, another first solder mask layer SM1 can be disposed on the bottom surface 12 of the substrate 1. The convex structure T is disposed on the first solder mask layer SM1. The sensing chip 2 is disposed above the substrate 1. The engaging layer 3 is adhered between the substrate 1 and the sensing chip 2. Furthermore, the engaging layer 3 covers the convex structure T, such that the convex structure T and the sensing chip 2 are not in contact with each other.

Specifically, the convex structure T has a first stepped surface T1, and the first stepped surface T1 is higher than an upper surface E of the first solder mask layer SM1. Preferably, the convex structure T further includes a second stepped surface T2, and the second stepped surface T2 surrounds an outer side of the first stepped surface T1. The first stepped surface T1 is higher than the second stepped surface T2, and the second stepped surface T2 is higher than the upper surface E of the first solder mask layer SM1.

Figure 3:
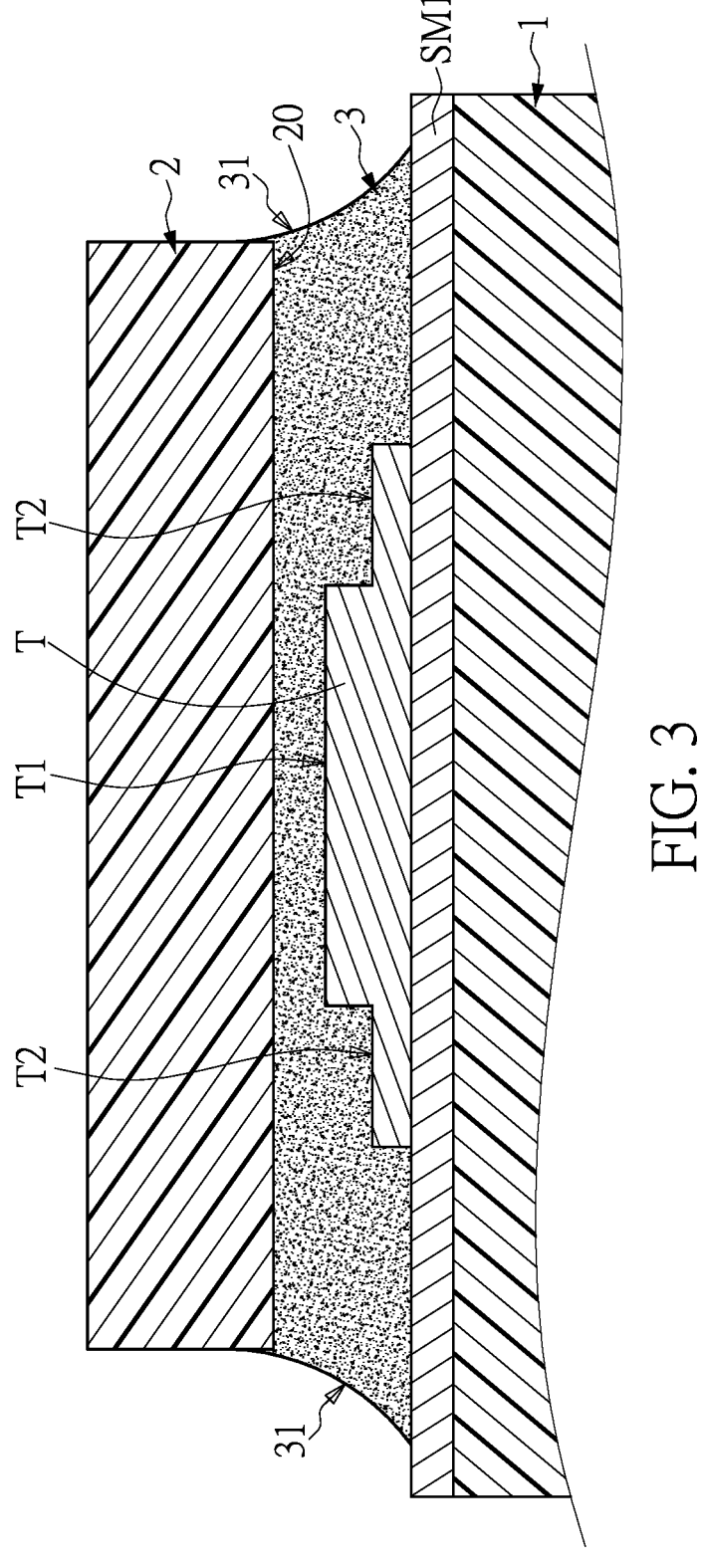
FIG. 3 is a partial schematic enlarged view of another implementation of the sensor package structure according to the first embodiment of the present disclosure.
Figure 4:
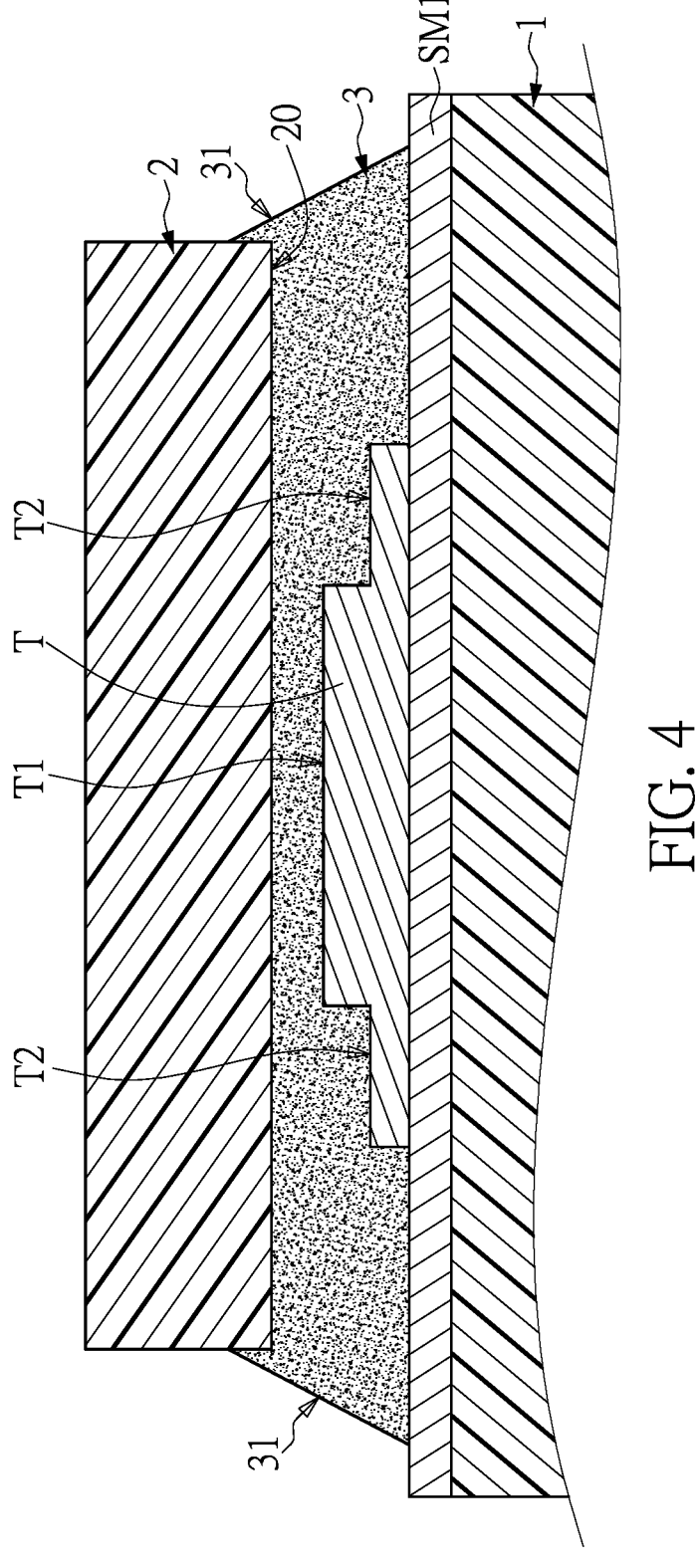
FIG. 4 is a partial schematic enlarged view of yet another implementation of the sensor package structure according to the first embodiment of the present disclosure.
Figure 5:
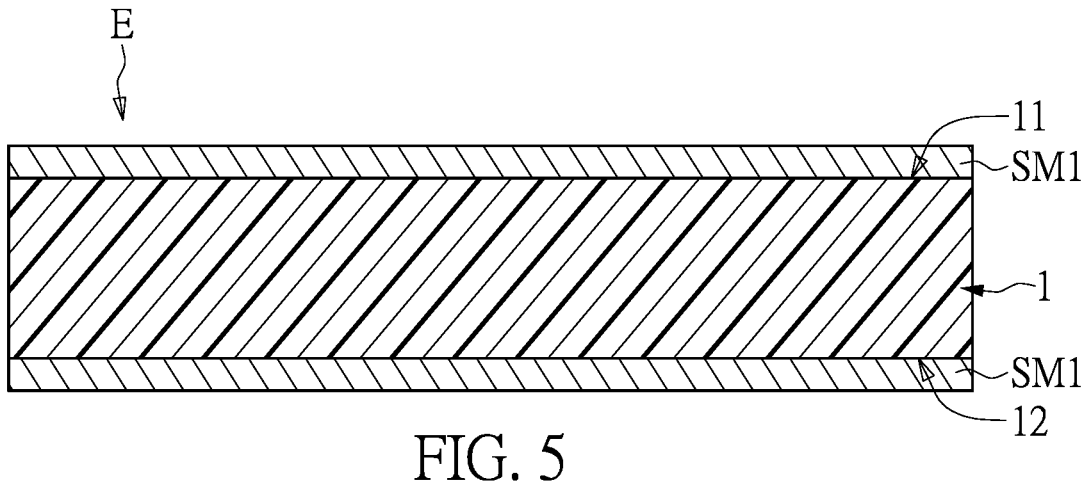
FIG. 5 to FIG. 9 are schematic views showing formation of a convex structure of the sensor package structure according to the present disclosure.
Figure 6:
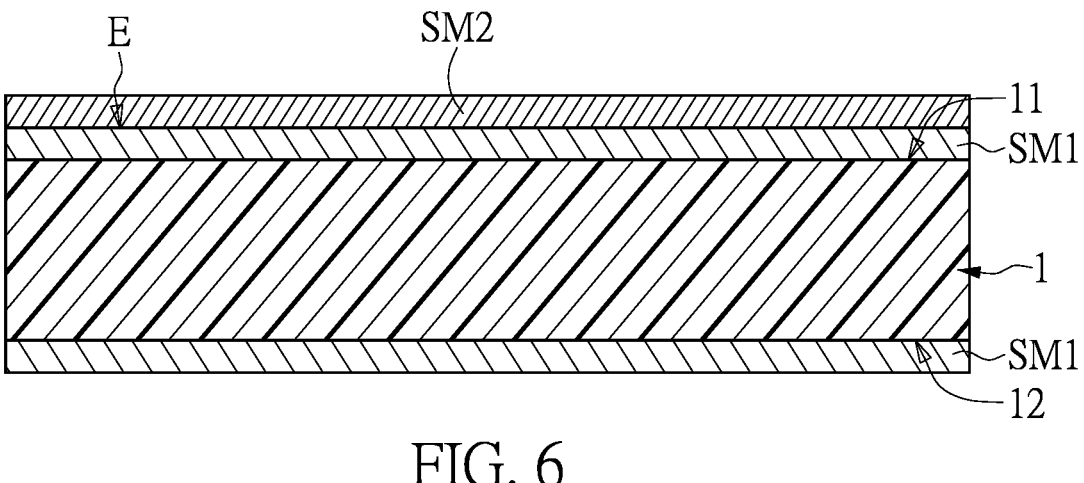

In the first embodiment, the engaging layer 3 is made of a liquid epoxy resin. As shown in FIG. 1, a contour of a side wall 31 of the engaging layer 3 is a convex curved surface, but the present disclosure is not limited thereto. Referring to FIG. 3 and FIG. 4, FIG. 3 and FIG. 4 are partial schematic enlarged views of different implementations of the sensor package structure according to the first embodiment of the present disclosure. In FIG. 3, the contour of the side wall 31 of the engaging layer 3 is a convex curved surface. In FIG. 4, the contour of the side wall 31 of the engaging layer 3 is an inclined surface. In addition, the sensor package structure M further includes a supporting layer 4, a light-permeable element 5, an encapsulation compound 6, and a plurality of metal wires 7. The light-permeable element 5 is disposed above the sensing chip 2, and the supporting layer 4 is disposed between the light-permeable element 5 and the sensing chip 2. The supporting layer 4 can be made of an opaque adhesive material. The light-permeable element 5 can be fixed on the sensing chip 2 through the supporting layer 4. The supporting layer 4 is used to separate the light-permeable element 5 and the sensing chip 2, and surroundingly defines an enclosed space S. The sensing chip 2 has a sensing region 21 that is located in the enclosed space S.

For example, the sensing chip 2 may be an image sensing die, such as a complementary metal oxide semiconductor (CMOS) sensing die. The light-permeable element 5 can be flat transparent glass. The encapsulation compound 6 can be a liquid compound or a molding compound. However, the present disclosure is not limited thereto.

The plurality of metal wires 7 are electrically connected to the sensing chip 2 and the substrate 1. Specifically, one end of each of the metal wires 7 is connected to a conducting portion 2P of the sensing chip 2, and another end of each of the metal wires 7 is connected to a pad 1P of the substrate 1. Moreover, any of the metal wires 7 can be formed by forward bonding or reverse bonding, and is not limited in the present disclosure. The encapsulation compound 6 is disposed on the substrate 1, and the sensing chip 2, the supporting layer 4, the metal wires 7, and a part of the light-permeable element 5 are embedded in the encapsulation compound 6.

A method of manufacturing the sensor package structure M according to the first embodiment of the present disclosure is described below. Referring to FIG. 19, FIG. 19 is a flowchart of a manufacturing method of a sensor package structure according to the present disclosure. The manufacturing method of the sensor package structure M provided in the first embodiment of the present disclosure at least includes the following steps.

Step S10: providing a substrate and forming two first solder mask layers on a top surface and a bottom surface of the substrate, respectively.

Step S11: forming a second solder mask layer on the first solder mask layer that is disposed on the top surface.

Step S12: performing a first lithography operation to partially remove the second solder mask layer, and configuring a remaining part of the second solder mask layer to be centrally disposed on an upper surface of the first solder mask layer for formation of a convex structure.

Step S13: fixing a sensing chip to the substrate through an engaging layer, in which the engaging layer is adhered between the substrate and the sensing chip and covers the convex structure, such that the convex structure and the sensing chip are not in contact with each other.

Step S14: forming a supporting layer on the sensing chip and placing a light-permeable layer on the supporting layer, in which the supporting layer defines an enclosed space, and a sensing region of the sensing chip is located in the enclosed space.

Step S15: providing a plurality of metal wires to electrically connect the substrate and the sensing chip.

Step S16: placing an encapsulation compound on the substrate, in which the sensing chip, the supporting layer, the plurality of metal wires, and a part of the light-permeable element are embedded in the encapsulation compound.

FIG. 5 to FIG. 9 are schematic views showing formation of a convex structure of the sensor package structure according to the present disclosure. According to the above steps and referring to FIG. 5 to FIG. 7, the first solder mask layer SM1 is formed on each of the top surface 11 and the bottom surface 12 of the substrate 1. The second solder mask layer SM2 is continually formed on the first solder mask layer SM1 that is disposed on the top surface 11. A peripheral part of the second solder mask layer SM2 is removed by performing the first lithography operation, and the remaining part of the second solder mask layer SM2 that is centrally disposed on an upper surface E of the first solder mask layer SM1 remains.

Figure 7:
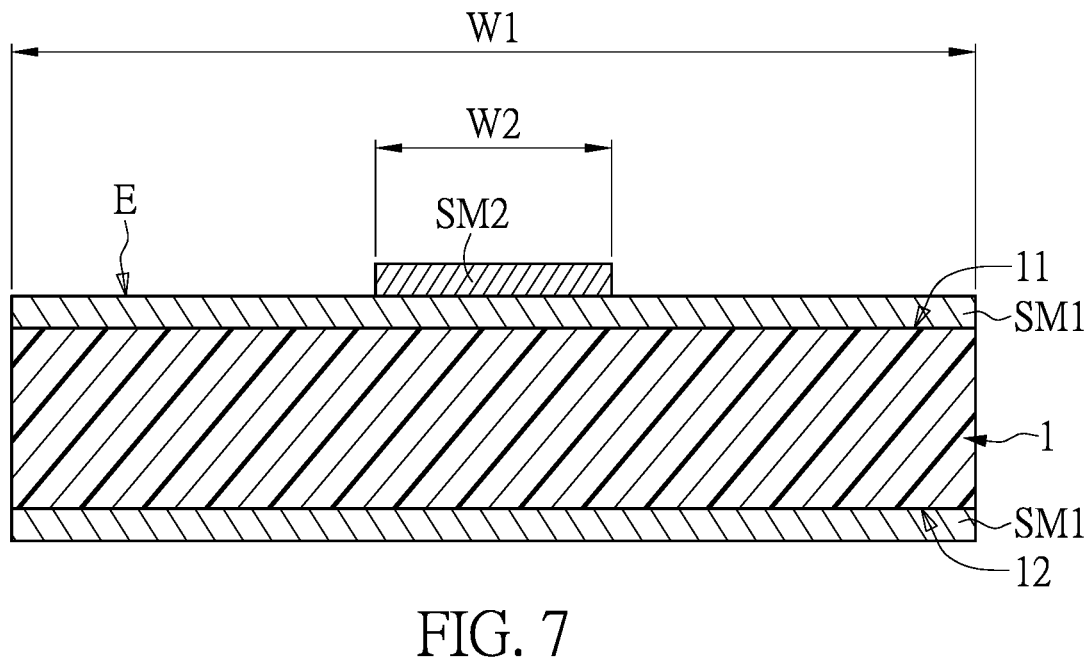

In other words, the remaining part of the second solder mask layer SM2 is centrally disposed on the upper surface E of the first solder mask layer SM1 to form the convex structure. As shown in FIG. 7, the second solder mask layer SM2 is stacked above the first solder mask layer SM1, a width W2 of the second solder mask layer SM2 is smaller than a width W1 of the first solder mask layer SM1, and the second solder mask layer SM2 protrudes relative to the first solder mask layer SM1.

It should be noted that the first solder mask layer SM1 and the second solder mask layer SM2 can be made of a same material, such as solder resist ink. A quantity of the solder mask layer is not limited in the present disclosure. Referring to FIG. 20, FIG. 20 is a flowchart showing step S121 to step S123 of the manufacturing method of the sensor package structure according to the present disclosure. The process of performing the first lithography operation to partially remove the second solder mask layer SM2 (step S12) further includes the following steps.

Step S121: forming a third solder mask layer on the first solder mask layer and the second solder mask layer that are disposed on the top surface.

Step S123: performing a second lithography operation to partially remove the third solder mask layer, such that a remaining part of the third solder mask layer covers the second solder mask layer.

Figure 8:
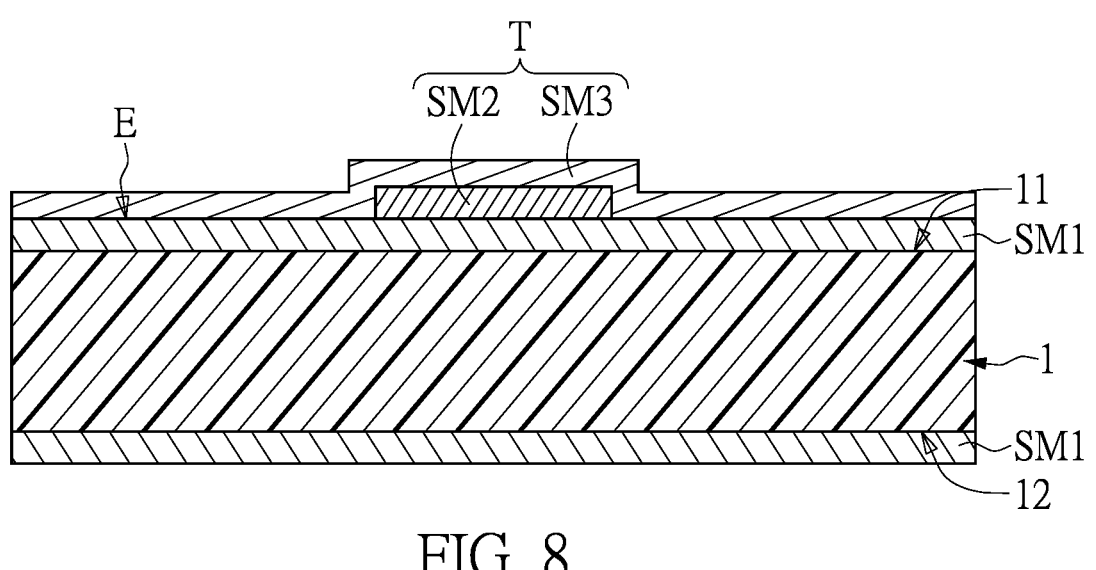
Figure 9:
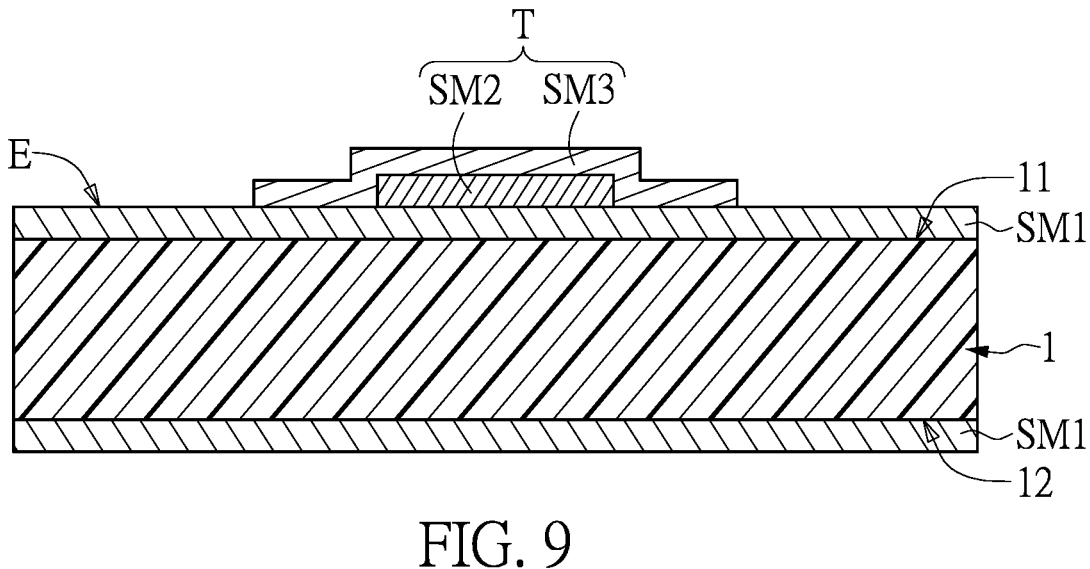
Figure 10:
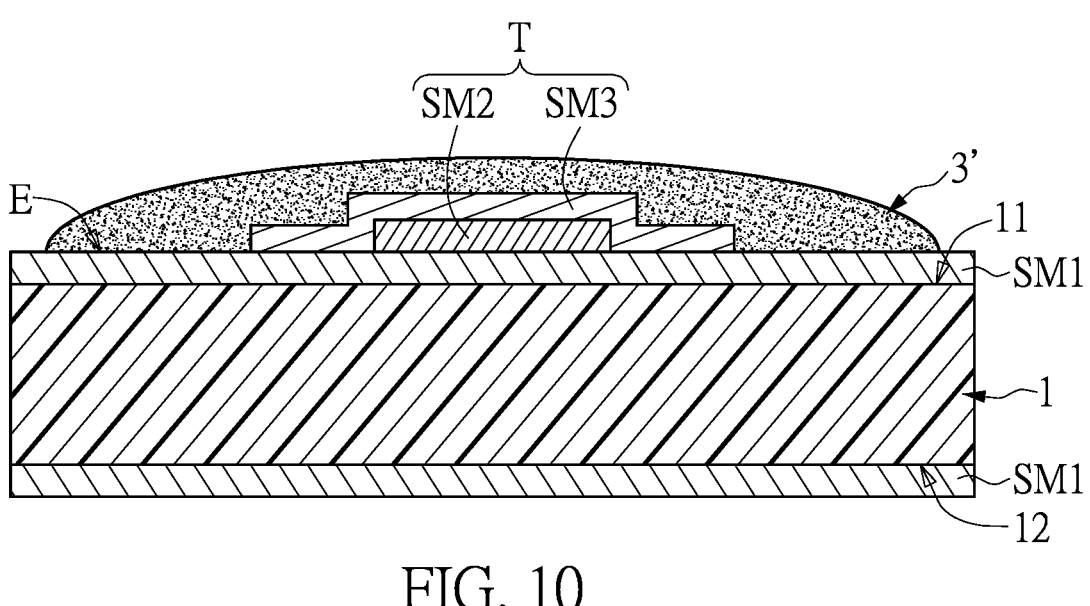
FIG. 10 to FIG. 13 are schematic views showing formation of an engaging layer of the sensor package structure according to the first embodiment of the present disclosure.
Figure 11:
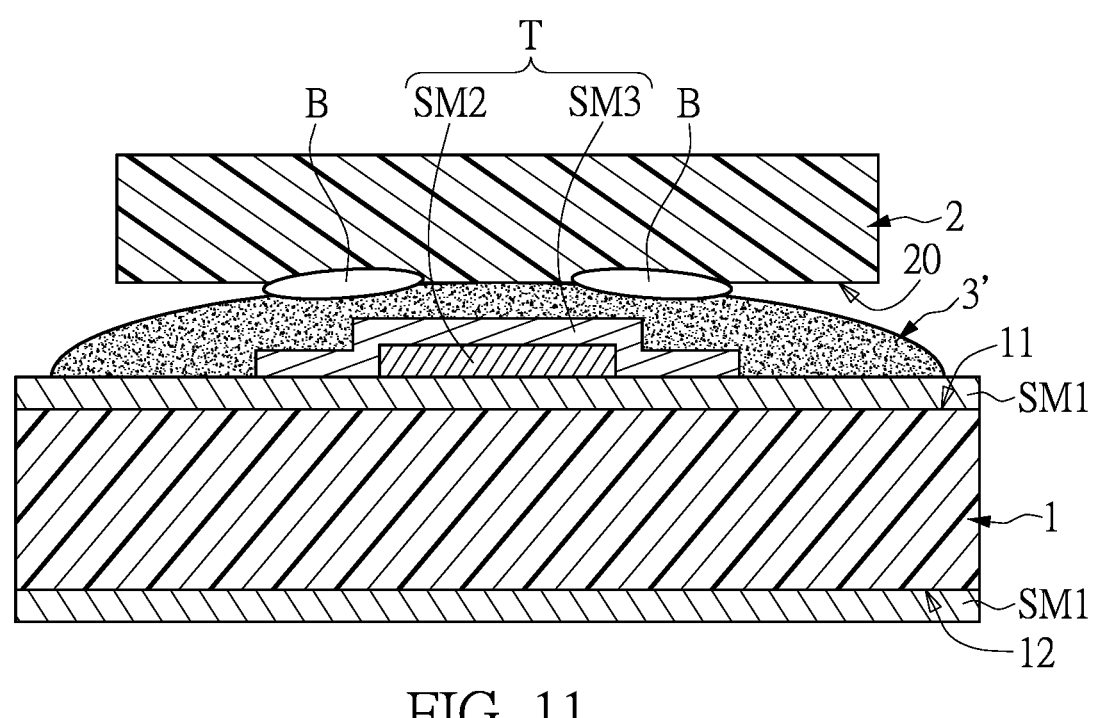
Figure 12:
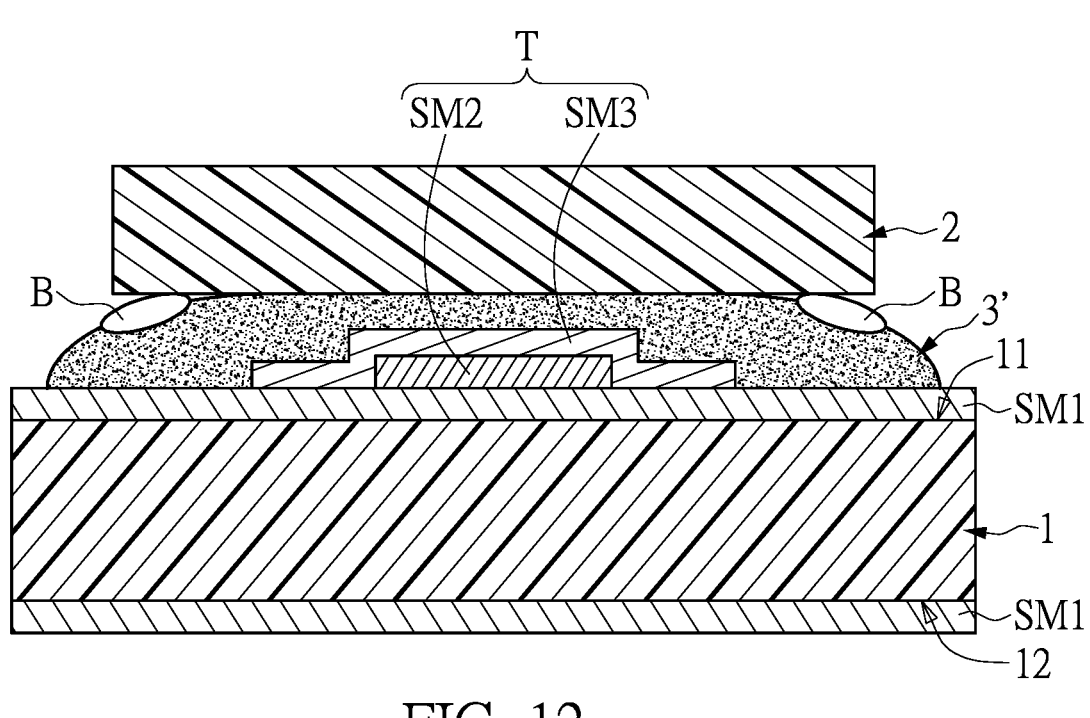

According to the above steps and referring to FIG. 8 and FIG. 9, in addition to the second solder mask layer SM2, the convex structure T further includes a third solder mask layer SM3. The third solder mask layer SM3 is formed on the first solder mask layer SM1 and the second solder mask layer SM2 that are disposed on the top surface 11. A peripheral part of the third solder mask layer SM3 is removed by performing the second lithography process, and the remaining part of the third solder mask layer SM3 that is centrally disposed on the upper surface E of the first solder mask layer SM1 remains to cover the second solder mask layer SM2, so as to form the convex structure T in FIG. 2.

After forming the convex structure T on the substrate 1, the sensing chip 2 can be glued on the substrate 1. Referring to FIG. 21, FIG. 21 is a flowchart showing step S131 to step S133 of the manufacturing method of the sensor package structure according to the present disclosure. The process of fixing the sensing chip 2 to the substrate 1 through the engaging layer 3 (step S13) further includes the following steps.

Step S131: putting a glue on the first solder mask layer, in which the glue covers the convex structure.

Step S133: placing the sensing chip on the glue, such that the glue is formed into the engaging layer to adhere the substrate and the sensing chip.

According to the above steps and referring to FIG. 10 to FIG. 13, FIG. 10 to FIG. 13 are schematic views showing formation of an engaging layer of the sensor package structure according to the first embodiment of the present disclosure. A glue 3' is disposed on the first solder mask layer SM1, and the glue 3' can be a liquid or paste adhesive (e.g., a liquid epoxy resin). The glue 3' covers the convex structure T, which includes the second solder mask layer SM2 and the third solder mask layer SM3. Since the convex structure T is higher in a center part and lower in a peripheral part, a surface of the glue 3' is an arc-shaped surface when the glue 3' covers the convex structure T. A height of the arc-shaped surface is the highest in the center part, while a height of the glue 3' is gradually decreased from the center part to the peripheral part.

Therefore, when the sensing chip 2 is disposed on the glue 3', the lower surface 20 of the sensing chip 2 first contacts the center part of the glue 3'. Afterwards, the sensing chip 2 continues to be pressed down, such that an area of the lower surface 20 that contacts the glue 3' is increased. In this way, air B between the lower surface 20 and the glue 3' is squeezed from the inside (i.e., the center part of the glue 3') to the outside (i.e., the peripheral part of the glue 3') along the arc-shaped surface, so as to be diffused to an external environment.

Figure 13:
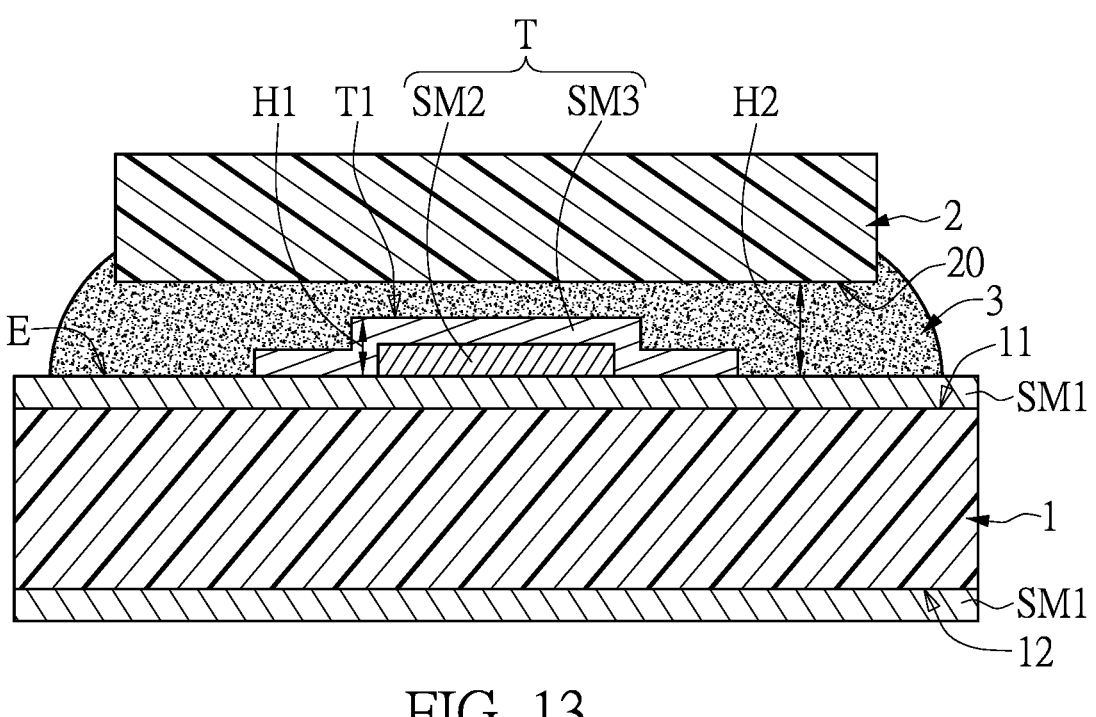

As shown in FIG. 13, the glue 3' is molded to form the engaging layer 3 for bonding the substrate 1 and the sensing chip 2. The engaging layer 3 is adhered between the substrate 1 and the sensing chip 2 and covers the convex structure T, such that the convex structure T and the sensing chip 2 are not in contact with each other. As such, when the sensing chip 2 is adhered to the glue 3', the air between the sensing chip 2 and the glue 3' can be squeezed from the inside to the outside through the structural design of the convex structure T on the substrate 1, thereby decreasing the possibility of air bubbles remaining inside the engaging layer 3 and reducing the adhesive strength.

The convex structure T has a first height H1, which is a distance between the first stepped surface T1 and the upper surface E of the first solder mask layer SM1. The engaging layer 3 has a second height H2, which is a distance between the upper surface E of the first solder mask layer SM1 and the lower surface 20 of the sensing chip 2. The first height H1 is smaller than the second height H2. Preferably, the first height H1 has a value ranging between 0 and 0.7 times of the second height H2 (i.e., $0 < H1 < (0.7)*H2$).

Since the first stepped surface T1 is higher than the upper surface E of the first solder mask layer SM1, a thickness of the engaging layer 3 between the first stepped surface T1 and the lower surface 20 of the sensing chip 2 (i.e., the center part of the engaging layer 3) is small, and a thickness of the engaging layer 3 between the upper surface E and the lower surface 20 of the sensing chip 2 (i.e., the peripheral part of the engaging layer 3) is large. Therefore, the thickness of the peripheral part of the engaging layer 3 is greater than the thickness of the center part of the engaging layer 3 through the structural design of the convex structure T. The engaging layer 3 can utilize the peripheral part having the larger thickness to absorb a stress imposed by the change of temperature. That is, the engaging layer 3 receives a smaller TCT (temperature cycling test) stress. Furthermore, the thickness of the center part is the distance between the first stepped surface T1 and the lower surface 20 of the sensing chip 2, and the thickness of the peripheral part is the second height H2.

Reference is further made to FIG. 1. After the sensing chip 2 is adheres to the substrate 1 through the engaging layer 3, the supporting layer 4 is formed on the sensing chip 2, and the light-permeable element 5 is provided on the supporting layer 4. The supporting layer 4 defines the enclosed space S, and the sensing region 21 of the sensing chip 2 is located in the enclosed space S. Then, the plurality of metal wires 7 are provided to electrically connect the substrate 1 and the sensing chip 2. Lastly, the encapsulation compound 6 is provided on the substrate 1, and the sensing chip 2, the supporting layer 4, the metal wires 7 and a part of the light-permeable element 5 are embedded in the encapsulation compound 6, so as to complete the sensor package structure M. The sensor package structure M can be soldered and fixed on an electronic component (not shown in the figures) through a plurality of solder balls 8, such that the sensor package structure M can be electrically coupled to the electronic component.

Second Embodiment

Figure 14:
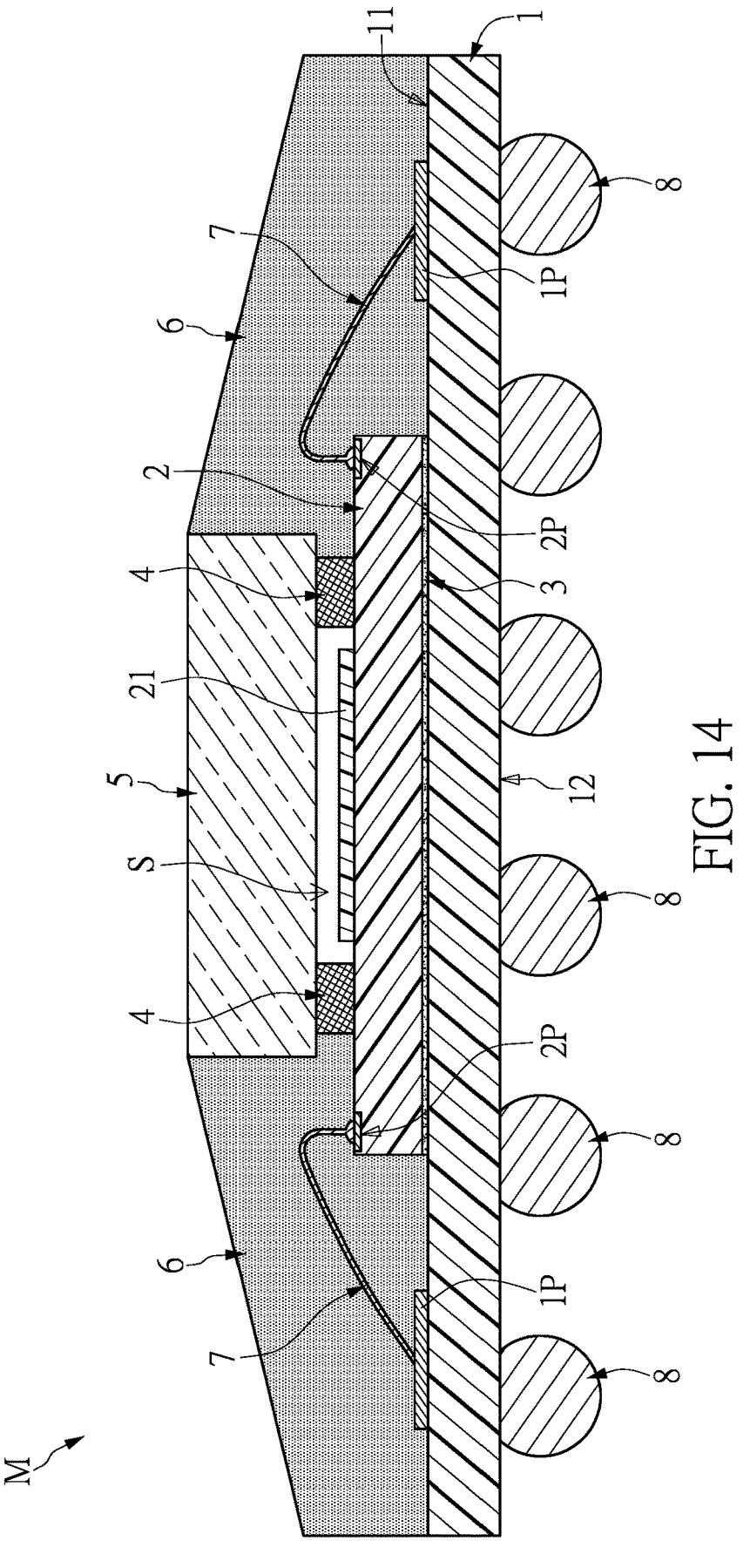
FIG. 14 is a schematic cross-sectional view of a sensor package structure according to a second embodiment of the present disclosure.
Figure 15:
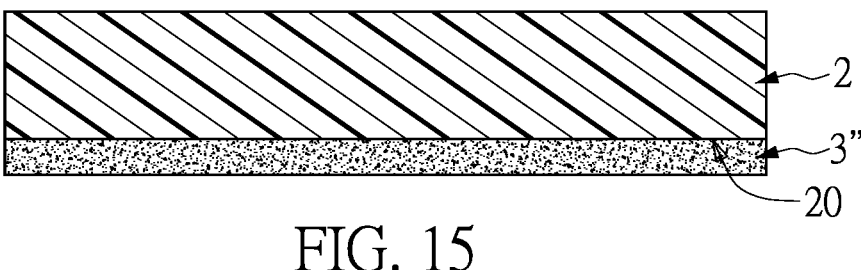
FIG. 15 to FIG. 18 are schematic views showing formation of an engaging layer of the sensor package structure according to the second embodiment of the present disclosure.
Figure 16:
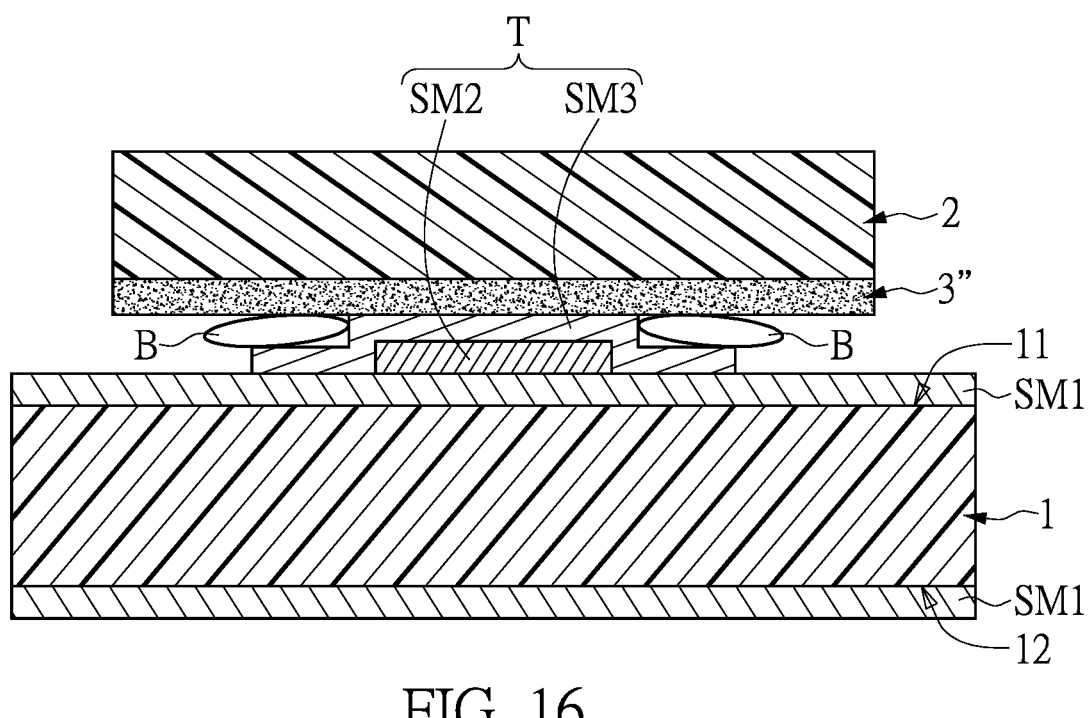
Figure 17:
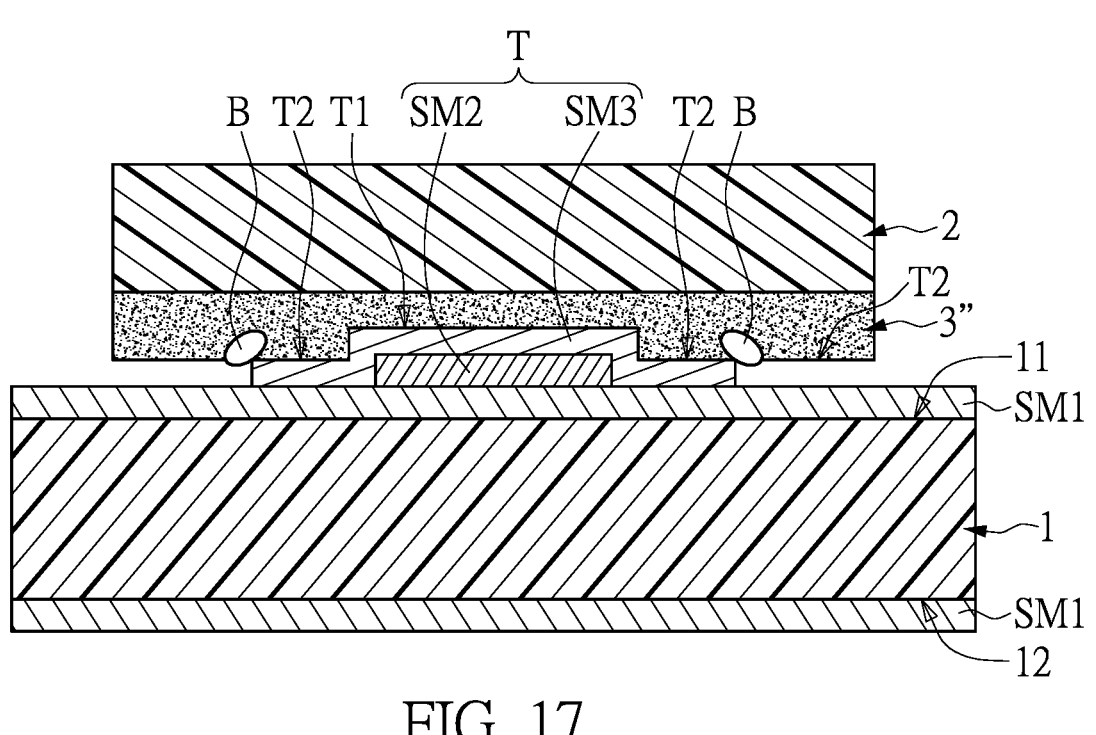

Referring to FIG. 14, FIG. 14 is a schematic cross-sectional view of a sensor package structure according to a second embodiment of the present disclosure. A second embodiment of the present disclosure provides a sensor package structure M, which includes a substrate 1, a sensing chip 2, an engaging layer 3, a supporting layer 4, a light-permeable element 5, an encapsulation compound 6, and a plurality of metal wires 7. A first solder mask layer SM1 is disposed on the substrate 1, and a convex structure T is disposed on the first solder mask layer SM1.

The sensor package structure M in the second embodiment has a structure similar to that of the sensor package structure M in the first embodiment, and the similarities therebetween will not be reiterated herein. The main difference between the second embodiment and the first embodiment is that the material and a forming method of the engaging layer 3 are different. In the second embodiment, the engaging layer 3 can be a strip-shaped or a film-shaped adhesive, such as a die attach film (DAF).

Figure 22:
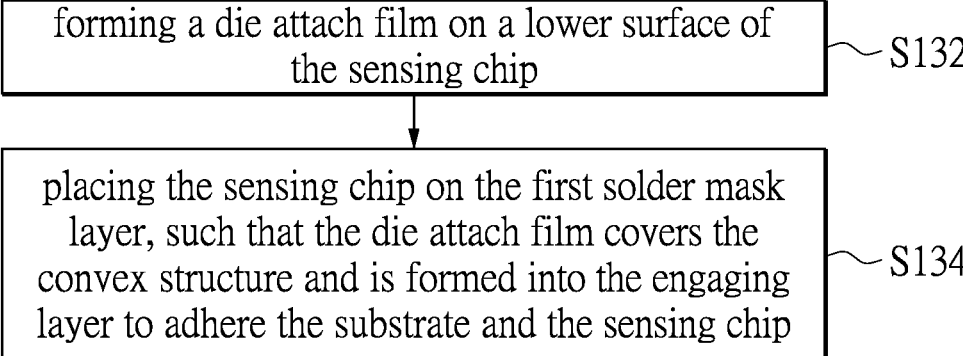
FIG. 22 is a flowchart showing step S132 to step S134 of the manufacturing method of the sensor package structure according to the present disclosure.

Referring to FIG. 22, FIG. 22 is a flowchart showing step S132 to step S134 of the manufacturing method of the sensor package structure according to the present disclosure. The process of fixing the sensing chip 2 to the substrate 1 through the engaging layer 3 (step S13) further includes the following steps.

Step S132: forming a die attach film on a lower surface of the sensing chip.

Step S134: placing the sensing chip on the first solder mask layer, such that the die attach film covers the convex structure and is formed into the engaging layer to adhere the substrate and the sensing chip.

According to the above steps and referring to FIG. 15 to FIG. 18, FIG. 15 to FIG. 18 are schematic views showing formation of an engaging layer of the sensor package structure according to the second embodiment of the present disclosure. A die attach film 3" is formed on the lower surface 20 of the sensing chip 2. When the sensing chip 2 is disposed on the first solder mask layer SM1, the die attach film 3" faces the convex structure T. The die attach film 3" contacts the first stepped surface T1 that is located in the center part of the convex structure T, and then contacts the second stepped surface T2 that is located outside the convex structure T. In this way, the air B between the die attach film 3", the first stepped surface T1, and the second stepped surface T2 is squeezed from the inside (i.e., the first stepped surface T1) to the outside (i.e., the second stepped surface T2), so as to be diffused to the external environment.

Figure 18:
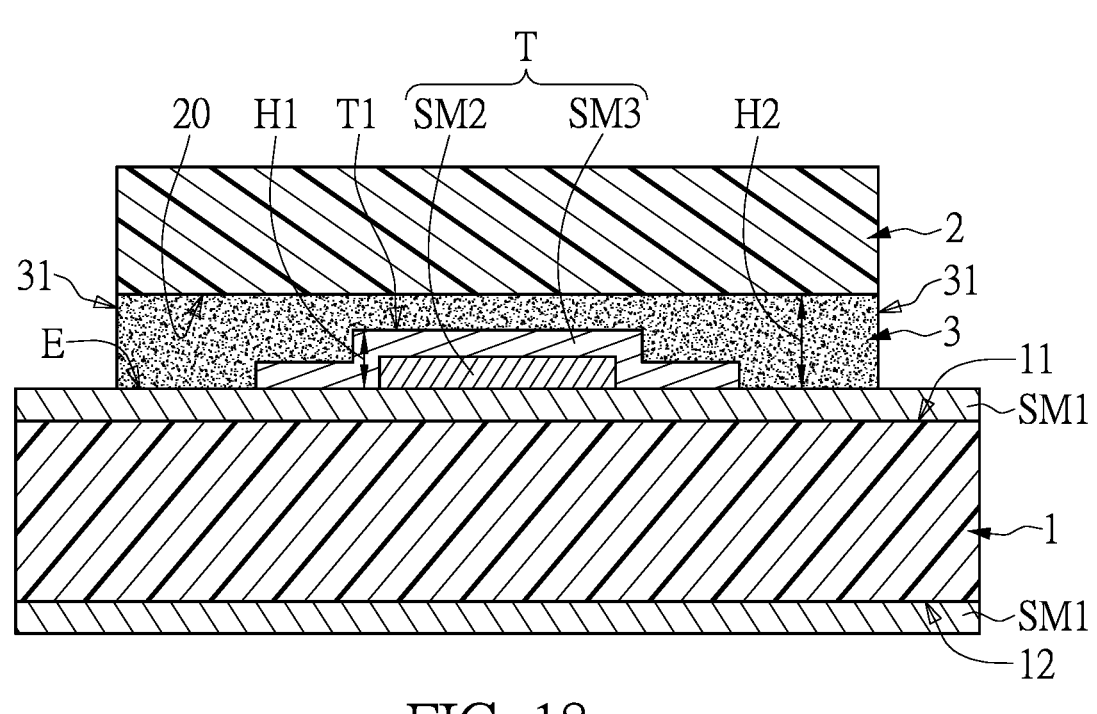

As shown in FIG. 18, the die attach film 3" is molded to form the engaging layer 3 for bonding the substrate 1 and the sensing chip 2. The engaging layer 3 is adhered between the substrate 1 and the sensing chip 2 and covers the convex structure T, such that the convex structure T and the sensing chip 2 are not in contact with each other, and a contour of a side wall of the engaging layer 3 is a vertical surface. As such, when the sensing chip 2 is adhered to the die attach film 3", the air between the sensing chip 2 and the die attach film 3" can be squeezed from the inside to the outside through the structural design of the convex structure T on the substrate 1, thereby decreasing the possibility of air bubbles remaining inside the engaging layer 3 and reducing the adhesive strength.

The convex structure T has a first height H1, which is a distance between the first stepped surface T1 and an upper surface E of the first solder mask layer SM1. The engaging layer 3 has a second height H2, which is a distance between the upper surface E of the first solder mask layer SM1 and the lower surface 20 of the sensing chip 2. The first height H1 is smaller than the second height H2. Preferably, the first height H1 is 0 to 0.7 times the second height H2 (i.e., $0 < H1 < (0.7) * H2$). Moreover, a thickness of a peripheral part of the engaging layer 3 is greater than a thickness of a center part of the engaging layer 3 through the structural design of the convex structure T. The engaging layer 3 can utilize the peripheral part having the larger thickness to absorb a stress imposed by the change of temperature. That is, the engaging layer 3 receives a smaller TCT (temperature cycling test) stress, so as to enhance the adhesive strength of the engaging layer 3 and reduce the probability of peeling between the sensing chip 2 and the substrate 1.

Beneficial Effects of the Embodiments

In conclusion, in the sensor package structure and the manufacturing method thereof provided by the present disclosure, the convex structure T can be formed on the first solder mask layer SM1 of the substrate 1. Hence, the sensing chip 2 will first contact the convex structure T when being adhered to the substrate 1 through the engaging layer 3, such that the air is squeezed from the inside to the outside for diffusion, and the residual air bubbles inside the engaging layer 3 can be reduced. In addition, the engaging layer 3 can be made of a liquid adhesive (e.g., a liquid epoxy resin) or a film-shaped adhesive (e.g., a die attach film).

When the glue 3' (i.e., the liquid epoxy resin) is used as the engaging layer 3, and the sensing chip 2 is disposed on the glue 3', the air B between the lower surface 20 and the glue 3' will be squeezed from the inside (i.e., the center part of the glue 3') to the outside (i.e., the peripheral part of the glue 3') along the arc-shaped surface, so as to be diffused to the external environment.

When the die attach film 3" is used as the engaging layer 3, the die attach film 3" contacts the first stepped surface T1 that is located in the center part of the convex structure T, and then contacts the second stepped surface T2 that is located outside the convex structure T. In this way, the air B between the die attach film 3", the first stepped surface T1, and the second stepped surface T2 is squeezed from the inside (i.e., the first stepped surface T1) to the outside (i.e., the second stepped surface T2), so as to be diffused to the external environment.

Moreover, the convex structure T has the first height H1, which is the distance between the first stepped surface T1 and the upper surface E of the first solder mask layer SM1. The engaging layer 3 has the second height H2, which is the distance between the upper surface E of the first solder mask layer SM1 and the lower surface 20 of the sensing chip 2. The first height H1 is smaller than the second height H2. Preferably, the first height H1 is 0 to 0.7 times the second height H2 (i.e., 0<H1<(0.7)*H2).

Moreover, the thickness of the peripheral part of the engaging layer 3 is greater than the thickness of the center part of the engaging layer 3 through the structural design of the convex structure T, so as to reduce the stress applied to the peripheral part of the engaging layer 3 (which is caused by the impact from the change of temperature), strengthen the adhesive strength of the engaging layer 3, and reduce the probability of peeling between the sensing chip 2 and the substrate 1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
a substrate;
a first solder mask layer disposed on the substrate;
a convex structure disposed on the first solder mask layer, wherein the convex structure has a first stepped surface, and the first stepped surface is higher than an upper surface of the first solder mask layer;
a sensing chip disposed above the substrate; and
an engaging layer adhered between the substrate and the sensing chip, wherein the engaging layer covers the convex structure, such that the convex structure and the sensing chip are not in contact with each other.

2. The sensor package structure according to claim 1, wherein the convex structure includes a second solder mask layer stacked above the first solder mask layer; wherein a width of the second solder mask layer is smaller than a width of the first solder mask layer, and the second solder mask layer protrudes relative to the first solder mask layer.

3. The sensor package structure according to claim 2, wherein the convex structure further includes a third solder mask layer that covers the second solder mask layer.

4. The sensor package structure according to claim 3, wherein the second solder mask layer and the third solder mask layer are centrally disposed on the upper surface of the first solder mask layer.

5. The sensor package structure according to claim 3, wherein the convex structure further has a second stepped surface that surrounds an outer side of the first stepped surface, and the first stepped surface is higher than the second stepped surface.

6. The sensor package structure according to claim 1, wherein a material of the engaging layer includes an epoxy resin, and a contour of a side wall of the engaging layer is a convex curved surface, a concave curved surface, or an inclined surface.

7. The sensor package structure according to claim 1, wherein a material of the engaging layer includes a die attach film, and a contour of a side wall of the engaging layer is a vertical surface.

8. The sensor package structure according to claim 1, wherein the convex structure has a first height, the engaging layer has a second height, and the first height is 0 to 0.7 times the second height; wherein the first height is a distance between the first stepped surface and the upper surface of the first solder mask layer, and the second height is a distance between the upper surface of the first solder mask layer and a lower surface of the sensing chip; wherein a distance between the first stepped surface and the lower surface of the sensing chip is smaller than the second height.

9. The sensor package structure according to claim 1, further comprising a supporting layer, a light-permeable element, an encapsulation compound, and a plurality of metal wires, wherein the light-permeable element is disposed above the sensing chip, the supporting layer is disposed between the light-permeable element and the sensing chip, the supporting layer is used to separate the light-permeable element and the sensing chip and surroundingly defines an enclosed space, the sensing chip has a sensing region that is located in the enclosed space, the plurality of metal wires electrically connect the substrate and the sensing chip, the encapsulation compound is disposed on the substrate, and the sensing chip, the supporting layer, the plurality of metal wires, and a part of the light-permeable element are embedded in the encapsulation compound.

\* \* \* \* \*